United States Patent [19]

Tsui

[11] Patent Number: 5,792,699
[45] Date of Patent: Aug. 11, 1998

[54] METHOD FOR REDUCTION OF REVERSE SHORT CHANNEL EFFECT IN MOSFET

[75] Inventor: Bing-Yue Tsui, Hsinchu, Taiwan

[73] Assignee: Industrial Technology Research Institute, Hsin-Chu, Taiwan

[21] Appl. No.: 657,074

[22] Filed: Jun. 3, 1996

[51] Int. Cl.$^6$ ............................................. H01L 21/336
[52] U.S. Cl. ........................... 438/290; 438/217; 438/308
[58] Field of Search .............................. 438/289, 290, 438/291, 217, 308

[56] References Cited

U.S. PATENT DOCUMENTS

| 5,378,650 | 1/1995 | Kimura | 437/63 |
| 5,395,773 | 3/1995 | Ravindhran et al. | 438/217 |
| 5,413,949 | 5/1995 | Hong | 437/44 |
| 5,547,882 | 8/1996 | Juang et al. | 438/290 |
| 5,571,745 | 11/1996 | Horiuchi | 438/217 |
| 5,618,743 | 4/1997 | Williams et al. | 438/217 |

OTHER PUBLICATIONS

Nishi et al, "Evidence of Channel Profile Modification Due To Implantation Damage Studied By A New Method, And Its Implication To Reverse Short Channel Effects of NMOSFETs", IEDM Tech. Digest, 1995, p. 993.

Orlowski et al, "Submicron Short Channel Effects Due To Gate Reoxidation Induced Lateral Interstatial Diffusion", IEDM Tech. Digest, p. 632, 1987.
Refferty et al, "Explanation of Reverse Short Channel Effect By Defect Gradients", IEDM Tech. Digest, 1993, p. 311.
Crowder et al, "The Effect Of Source/Drain Processing On The Reverse Short Channel Effect Of Deep Sub-Micron Bult And SOI NMOSFETs", IEDM Tech Dig p. 427, 1995.

Primary Examiner—Tuan H. Nguyen
Attorney, Agent, or Firm—George O. Saile; Stephen B. Ackerman

[57] ABSTRACT

This invention describes a manufacturing method for MOSFET devices that are free from reverse short channel effect usually found in such devices made by prior art processes. In contrast to the prior art process sequence, the channel implant is made after the source and drain already formed by implantation and its damage already annealed out. The enhanced diffusion of the channel implant, caused by damage generated point defects and responsible for the reverse short channel effect, is therefore avoided. The channel implantation uses high energy ions to penetrate through the polysilicon gate, forming a threshold voltage adjustment and punch-through barrier layer under the gate. The channel implant through the source/drain regions is deeper than the source/drain junctions so that the junction capacitance is reduced in comparison with the prior art.

16 Claims, 5 Drawing Sheets

METHOD FOR REDUCTION OF REVERSE SHORT CHANNEL EFFECT IN MOSFET

BACKGROUND OF THE INVENTION

1. Field of the Invention

This invention relates to a method for making metal-oxide-semiconductor field effect transistors (MOSFET) that are free from the reverse short channel effect (RSCE) which is an anomalous phenomenon deviating the theoretically predicted characteristics of the threshold voltage as a function of the channel length in MOSFET devices.

2. Description of the Related Art

The trend of the ever decreasing feature size of device elements in semiconductor integrated circuits (IC) is of utmost importance in increasing the density of circuit elements and device performance, both for the improvement of IC cost/performance. An important parameter in MOSFET is the threshold voltage for the device to turn on. This is the minimum required voltage applied to the gate of the MOSFET device so as to invert the conductivity of the surface of the semiconductor substrate, forming a conduction channel that is of the same conductivity type as the source and the drain of the MOSFET device. As the device size shrinks, the length of the conduction channel decreases and, after some point, the threshold voltage start to decrease appreciably with the channel length. The decrease of the threshold voltage with the channel length, as shown by curve 1 in the example of FIG. 1, is theoretically predicted. This phenomenon is called the short channel effect (SCE). A flat, or a predictable and controllable reduction of the threshold voltage, is desirable. However, in the usual MOSFET devices, deviation from this predicted device behavior occurs, such that the threshold actually increases with the decrease of channel length, before it eventually decreases rather sharply, as shown by curve 2 in FIG. 1. This phenomenon is called the reverse short channel effect (RSCE).

In practical MOSFET devices, there is often a channel implant to augment the substrate doping of the same conductivity. Thus, for NMOS, the substrate and the channel are of p-type, while for PMOS, the substrate and the channel are of n-type. The purpose of this channel implant is to adjust the threshold voltage, as well as to prevent the occurrence of punch. In p-type substrates, there is often a problem of surface inversion, which can be prevented by the channel implant. The concentration profile of the channel implant typically peaks at about a few tenths of a micron below the surface of the semiconductor substrate.

Orlowski et al. (IEDM Tech Dig., pp. 632, 1987) proposed that RSCE is caused by the enhanced diffusion of the channel implant, causing it to spread out from its peak, and its surface concentration to increase. The enhanced diffusion is proposed to be caused by spreading of excess point defects outward, vertically as well as laterally from the source and the drain regions, to some distance into the region of the channel implant. The excess point defects are generated when the surfaces of these regions are thermally oxidized, a phenomenon commonly called oxidation enhanced diffusion (OED).

Rafferty et al. (IEDM Tech. Dig., pp. 311, 1993) proposed instead that, for NMOS, RSCE is a result of the transient enhanced diffusion of the channel profile induced by source/drain implantation. They proposed that the source/drain implantation damage generates silicon self-interstitials which flow outward and then recombine (annihilated) at the silicon surface under the gate, giving rise to a flux of the channel implant impurity toward the surface, and raising the surface concentration of the channel impurity, leading to RSCE. A prime reason cited for this mechanism is that RSCE occurs regardless of whether the channel implant profile is initially flat or peaking at the substrate surface, or if it peaks somewhere below the substrate surface.

Crowder et al. (IEDM Tech. Dig., pp. 427, 1995) proposed yet another mechanism for the occurrence of RSCE in NMOS, which commonly uses arsenic as the doping impurity for the source and the drain. They suggest that when the source/drain arsenic peak concentration exceeds $2.5 \times 10^{20}$ cm$^{-3}$, arsenic may undergo deactivation following the mechanism proposed by Rousseau et al. (IEDM Tech. Dig., pp. 861, 1994):

where the subscript n is between 2 and 4, V denotes the lattice vacancy and I denotes the silicon self-interstitial. The above reaction is suggested as a deactivation process to produce excess interstitials. Crowder et al. then combined this mechanism of point defect generation with the mechanism of interstitial recombination at the silicon surface proposed by Rafferty et al. to arrive at a new mechanism of surface concentration enhancement of the channel implant, leading to RSCE.

The experimental study of Nishi et al. (IEDM Tech. Dig., pp. 993, 1995) appears to support the implantation damage model of Rafferty et al. rather than the arsenic deactivation model. Nishi et al. designed their experiments by implanting silicon through a narrow window in the drain region, with a varying distance of between this window and the edge of the gate region and studied the effect of this distance. Since the RSCE is quantitatively related to this distance, and since the silicon implant is not subject to deactivation as is arsenic according to the mechanism of Rousseau et al., the implantation damage is shown to be responsible of the RSCE, most likely through the generation of excess point defects.

For whichever of the above described mechanisms, RSCE can be avoided by using a new process according to this invention for the fabrication of MOSFET. FIGS. 2a–2c depict part of a most commonly used prior art process for the fabrication of MOSFET. Take the making of NMOS as an example. 1 in FIG. 2a is a P⁻ silicon substrate, on which field oxides 2 were previously formed by the method of local oxidation of silicon (LOCOS) for the purpose of dielectric isolation. The structure is then exposed to an energetic ion beam 3 of P-type doping impurity ions, which can be boron or boron fluoride BF$_2$, in an ion implanter to produce a channel layer, 4, of P-type dopant. The energy of the ion beam is selected such that the peak of the channel doping profile occurs near, or a few tenths of a micron below the substrate surface. An oxide is grown thermally on the surface of the silicon substrate in the area not covered by the field oxide. A polysilicon layer is then formed on top of the thermal oxide by the method of chemical vapor deposition (CVD). Through the standard method of photoresist deposition, photoresist exposure through a mask, photoresist development, reactive ion etching of the polysilicon and the gate oxide in the areas exposed through photoresist windows, and the removal of photoresist, a structure as shown in FIG. 2b is produced, in which 5 is the gate oxide, and 6 is the polysilicon gate. The structure is then exposed to an energetic beam of arsenic ions, 7, resulting in the formation of the source and the drain, 8. The dose of the source/drain implant is typically about $5 \times 10^{15}$ cm$^{-2}$. At this dosage level, the implantation creates significant damage to the silicon lattice, as well as producing amorphization of the lattice. The damage and the amorphization are removed by a subsequent annealing which also activate the implanted arsenic atoms. The annealing at the same time generate point defects which then cause the channel implant to increase its concentration at the silicon surface according to a combination of the mechanisms mentioned, giving rise to RSCE.

Kimura (U.S. Pat. No. 5,378,650, 1995) described a variation of process sequence from the above described prior art process for making NMOSFET. The channel implant of boron is implanted through an $SiO_2$ layer of 4000 Å, 2, in thickness in the form corresponding to the gate of a MOSFET, as depicted in FIG. 3. This requires ion beams of a higher energy of about 160 kev in order to penetrate the 4000 Å $SiO_2$ gate and form a so-called channel stopper first impurity layer, 3, in the silicon immediately under the gate. It also forms a second impurity layer, 4, deeper into the silicon substrate outside the gate, serving as a barrier against punch through. The source and the drain are formed afterward in the process sequence, in a similar manner as described in the prior art process depicted in FIG. 2c, by implantation of arsenic and subsequent annealing. During the annealing which follows the source/drain implantation, point defects are generated which will again cause the occurrence of RSCE according to the mechanisms already described.

Hong (U.S. Pat. No. 5,413,949, 1995) described a method of making self-aligned, fully overlapped, lightly doped drain (LDD) NMOSFET in a process in which the source and the drain are formed by arsenic ion implantation after the formation of the polysilicon gate. A separate shallow implant of boron ions at about 70 keV energy, and a deep implant of boron ions at about 160 keV energy, are made through the polysilicon gate that has polysilicon spacers above and in contact with it at its edges. There is no mention of annealing immediately after the source/drain implantation to remove damage prior to the boron channel implantation. The annealing process step prior to boron channel implant and deep boron implant is necessary for the prevention of RSCE. There is no mention of RSCE in the Hong invention.

High energy implantation of ions through gate oxides may raise concern about its effect on the integrity of the gate oxide. However, the experimental investigation of Koike et al. (Proc. Int. Symp. on Semicond. Manuf., pp. 24, 1995), who used this method for the reduction of the number of process steps, has shown no performance deterioration as a result.

SUMMARY OF THE INVENTION

It is a principal object of this invention to fabricate MOSFET devices that are free from the reverse short channel effect. In accordance to this invention, the reverse short channel effect is to be eliminated by preventing enhanced diffusion of the channel doping impurity near the source and the drain regions, causing the surface concentration of the channel impurity to increase near these regions.

It is a further object of this invention to provide a method for the fabrication of such MOSFET devices that are free of RSCE. In accordance to this invention, the method of prevention of enhanced diffusion of the channel impurity near the source and the drain region, the cause of RSCE, is to carry out source and drain implantation and to fully anneal out damage from this implantation prior to the channel implantation, reversing the sequence of the prior art process in which the channel implantation is made before the source/drain implantation.

In a manufacturing process according the method of this invention for making RSCE-free MOSFET, a silicon substrate of an appropriate conductivity type is selected, P-type for NMOSFET used as an example in the description of this invention. A thermal pad oxide layer is grown on the substrate. A layer of silicon nitride is deposited over the thermal oxide layer. A pattern of windows is open in the composite layer comprising the thermal oxide and the silicon nitride layers using conventional photolithographic method and reactive ion etching. Field oxides in the form of LOCOS are then grown in the windows. The silicon nitride film is then removed, and the pad oxide is then removed by dip etch, exposing active areas for the MOSFET. At this point, the process sequence of this invention differentiates itself from that of the prior art by not immediately following with a channel implantation. Instead, a gate oxide is then thermally grown on the open areas of the substrate, and a blanket CVD polysilicon layer is deposited. Following an sequence of photolithography and reactive ion etching, a gate structure is formed, leaving openings for sources and drains. Arsenic ions are implanted to form source and drain regions. Either conventional thermal annealing, or rapid thermal annealing, is then carried out to remove the implantation damage and restore crystallinity to the silicon lattice. During the annealing, point defects will be generated, but they will gradually decay and disappear. The channel implantation is then carried out to adjust the threshold voltage and serve as a punch-through barrier. This process sequence ensures that the channel impurity profile will not be altered due to enhanced diffusion caused by excess point defects coming from damage in the drain and source regions.

BRIEF DESCRIPTION OF THE DRAWINGS

FIG. 2a is a schematic cross-section showing a MOSFET that has been processed through the LOCOS and the channel implantation according to the prior art process;

FIG. 2b is a schematic cross-section showing a MOSFET that has been process to the formation of the polysilicon gate according to the prior art process;

FIG. 2c is a schematic cross-section showing a MOSFET that has been processed to the formation of the source and the drain by implantation according to the prior art process.

FIG. 4a is a schematic cross-section showing a MOSFET that has been processed through the LOCOS and the formation of the gate oxide-polysilicon gate structure in the process according to this invention;

FIG. 4b is a schematic cross-section showing a MOSFET that has been process to the source/drain implantation in the process according to this invention;

FIG. 4c is a schematic cross-section showing a MOSFET that has been processed through source/drain implantation and thermal annealing for damage removal, to the point for implantation for the threshold voltage adjustment and punch-through barrier in the process according to this invention.

FIG. 4d is a schematic cross-section showing a MOSFET device of FIG. 4c that has been further processed by forming a layer of insulator and opening contact holes to the source and the drain.

DESCRIPTION OF THE PREFERRED EMBODIMENT

While the method of this invention applies equally well to the fabrication of NMOSFET and PMOSFET with the interchange of the conductivity type of the substrate and the implant impurity species, for example arsenic interchanges with boron, we shall for the purpose of giving specific details use the example of manufacturing NMOSFET devices for the description of the preferred embodiment according to this invention.

Figure 1:
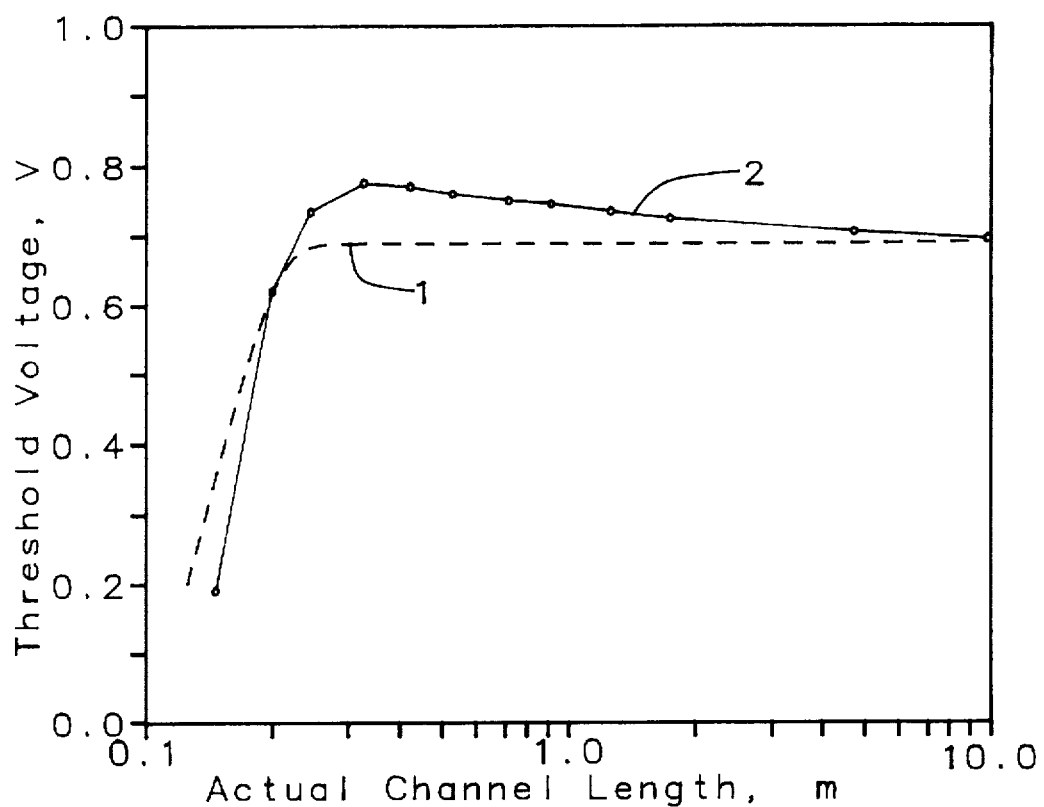
FIG. 1 plots behavior of the threshold gate voltage as a function of the real channel length of a MOSFET. Curve 1 shows the theoretically predicted short channel effect, and curve 2 shows the reverse short channel effect measured experimentally.
Figure 2A:
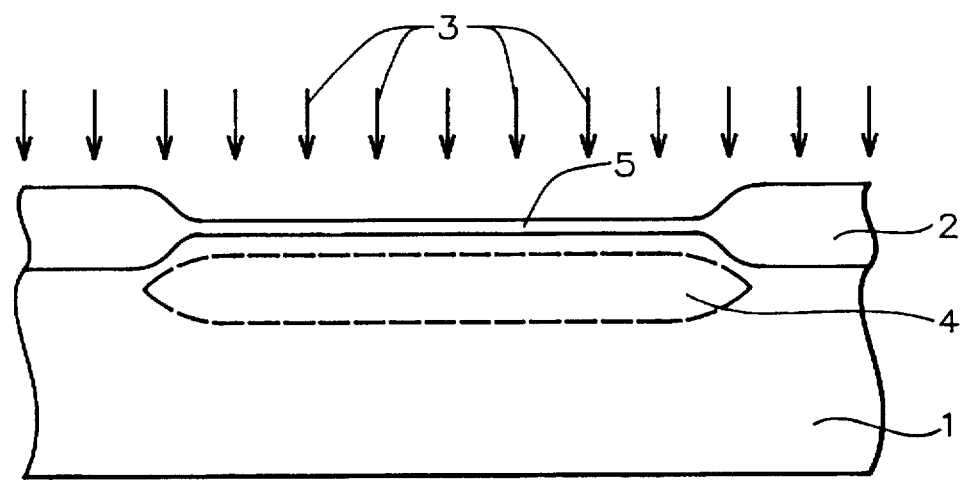
FIGS. 2a–2c are schematics of device structure cross-sections at various stages of the prior art process sequence.
Figure 2B:
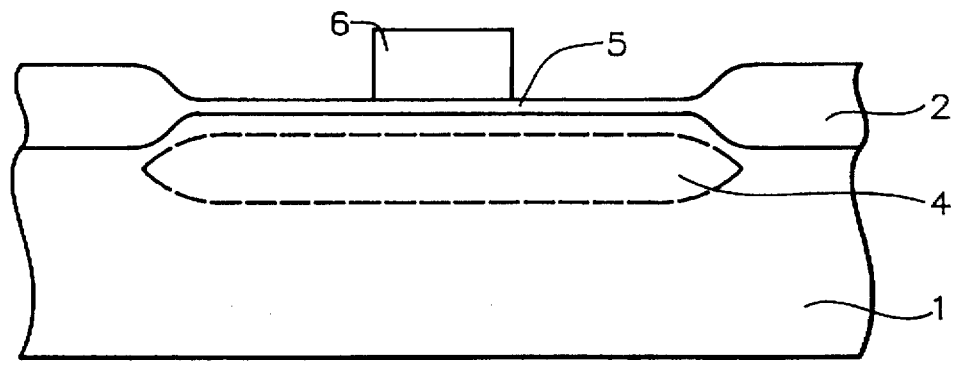
Figure 2C:
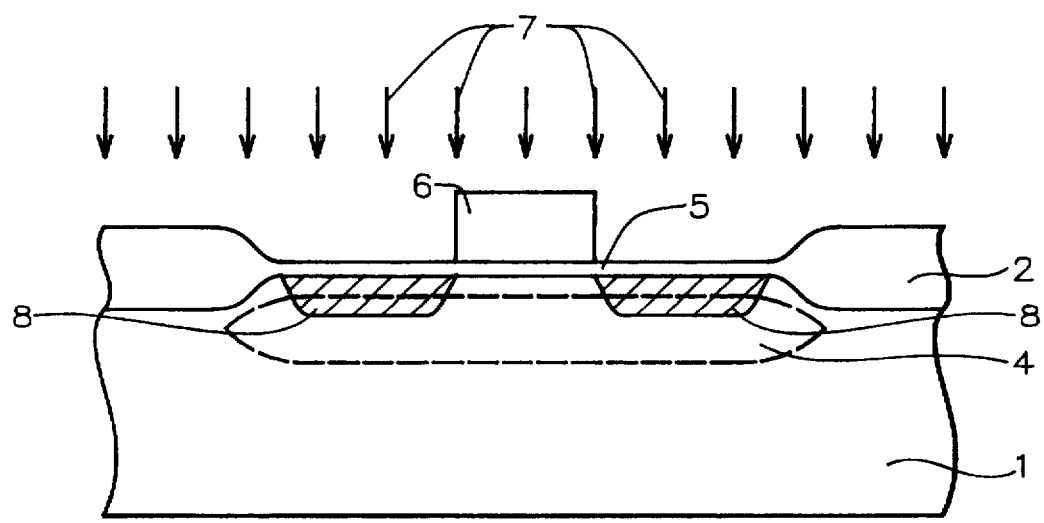
Figure 3:
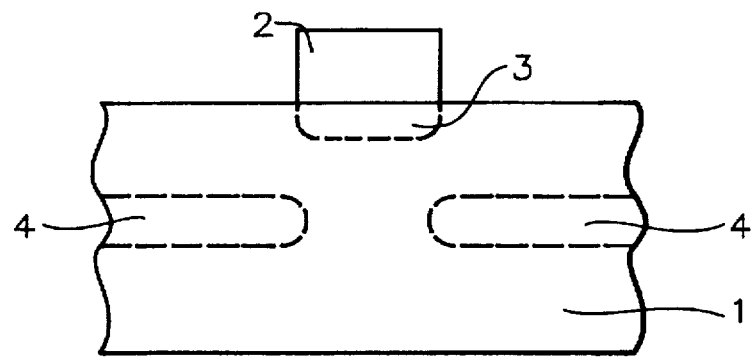
FIG. 3 shows yet another prior art process in which the implantation at once for both the channel stopper and the punch-through barrier is made after the formation of a thick oxide gate, but before the source/drain implantation.
Figure 4A:
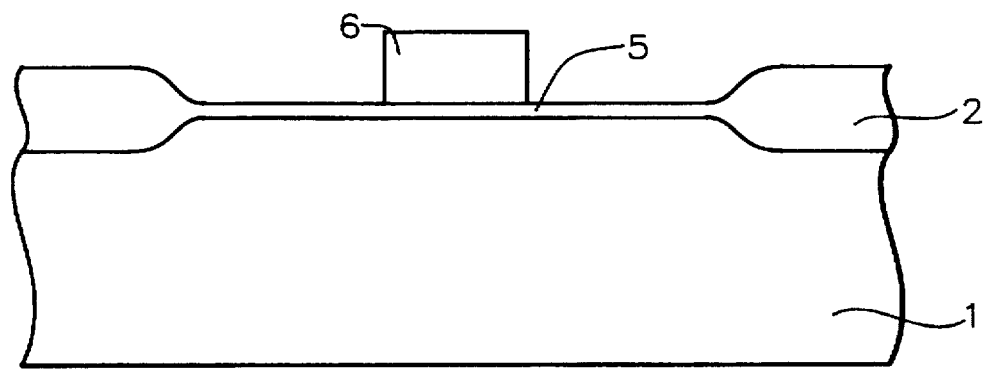
FIGS. 4a–4d are schematics of device structure cross-sections at various stages of the process sequence according to this invention.
Figure 4B:
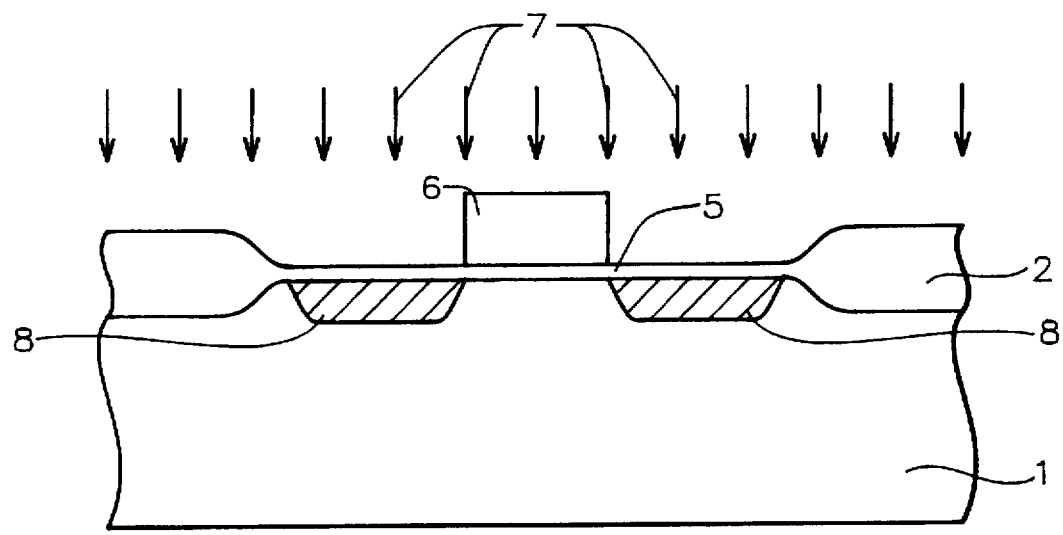
Figure 4C:
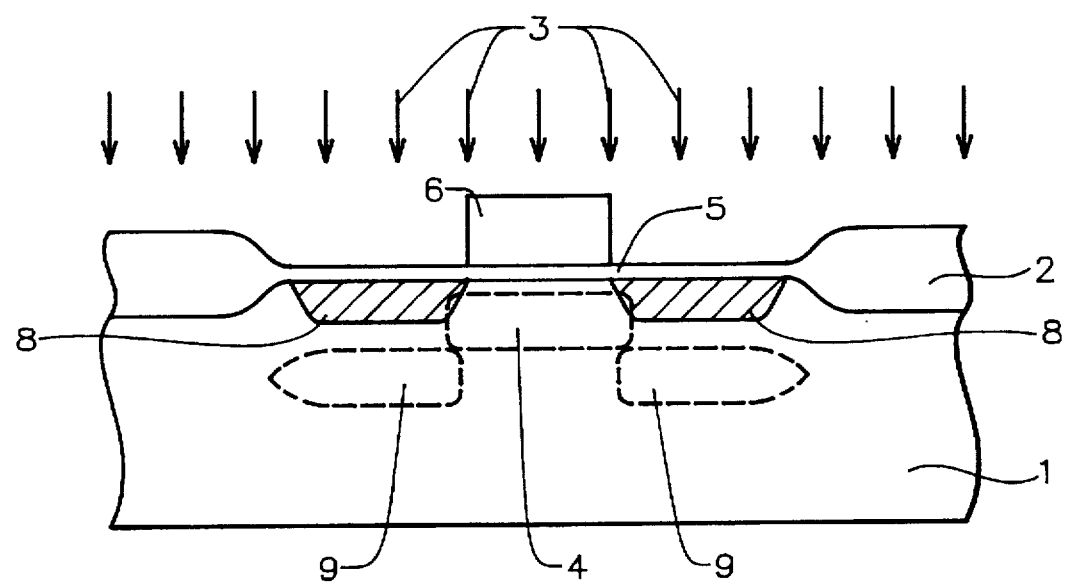

FIG. 4a shows the schematic cross-section of the structure produced at the process step when the polysilicon gate is formed. Starting with a properly cleaned P-type silicon substrate, 1 in FIGS. 4a–4c, a pad oxide is thermally grown over the entire substrate to a thickness of 100 to 500 Å. A silicon nitride layer, 1000 to 2000 Å thick, is formed on top of the pad oxide by blanket chemical vapor deposition. A layer of photoresist is coated on top of the silicon nitride, is then exposed through a mask containing a pattern of windows for field oxides, and is then developed. The exposed area of the silicon nitride layer is then etched off, preferably by means of ion etching, exposing the pad oxides underneath. Field oxides, 2 in FIGS. 4a–4c, are then grown in the areas of nitride openings to thickness between 0.3 and 1.0 µm. The silicon nitride and the pad oxide are then removed by etching. A layer of gate oxide, preferably between 50 and 200 Å in thickness, is then formed by thermal oxidation, preferably at 750° to 900° C. A blanket polysilicon layer, preferably between 1500 and 3000 Å in thickness, is grown on top of the gate oxide by the method of chemical vapor deposition. A layer of photoresist is coated on the polysilicon layer, is exposed through a mask containing a pattern of gate definition, and is developed to cover and protect the gate areas. An anisotropic reactive ion etching having a high Si/SiO$_2$ etch selectivity is used to remove polysilicon outside the gate areas, forming the polysilicon gate, 6 in FIGS. 4a–4c.

The substrate is then exposed to an ion beam of arsenic, 7 of FIG. 4b, to form the source and the drain regions 8. The substrate is then annealed, preferably by the method of rapid thermal annealing, at a temperature of 900° to 1100° C. for 10 to 30 seconds to remove implantation induced damage and to restore crystallinity in the amorphized regions. This annealing step will insure that the source and the drain regions will not generate point defects that can cause enhanced diffusion in subsequent process steps.

The substrate after the annealing step is then exposed to an energetic ion beam of boron, 3 in FIG. 4c, at 50 to 200 kev energy, depending on the thickness of the polysilicon gate, for a dose of $1\times10^{12}$ to $1\times10^{14}$ ions/cm$^2$. This produces a threshold voltage adjustment and punch-through barrier layer 4 and a punch-through barrier 9 as shown in FIG. 4c. The boron implanted through the source and drain regions penetrates to a position, 9, which is deeper than the source/drain junctions as shown in FIG. 4c. Since the channel doping is formed after the source/drain implantation damage had been annealed out, it will not be subject to enhanced diffusion near the source and the drain in the surface region.

Figure 4D:
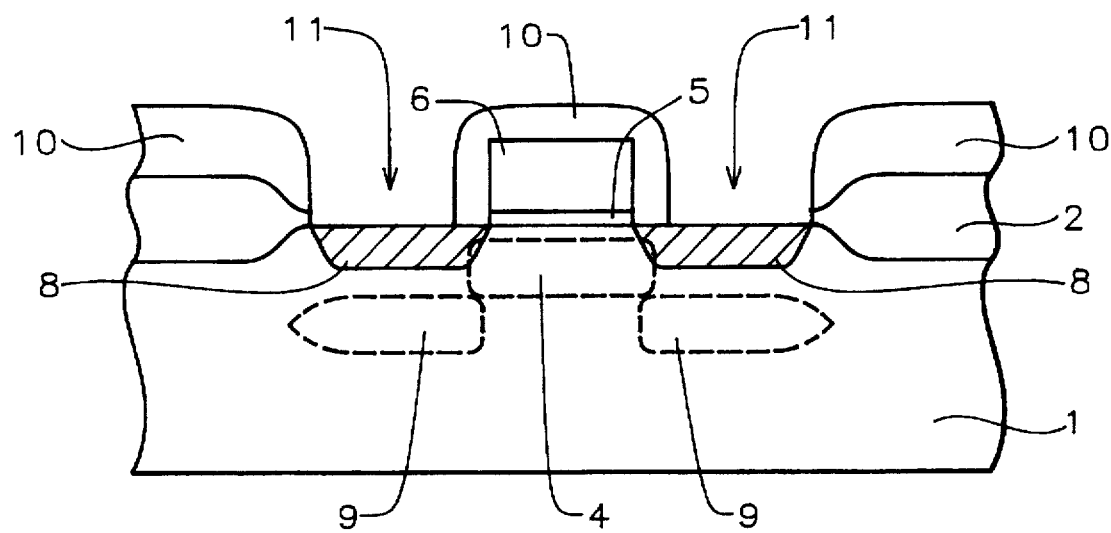

FIG. 4d shows a structure after further processing steps following the channel implantation. An insulating layer 10 is formed, preferably by the method of low-temperature chemical vapor deposition of SiO$_2$. Source and drain contact holes, 11, are then open using photolithography. The contact hole to the gate is open in a different cross-section plane, and is not shown in FIG. 4d.

While the method of this invention has been described by one particular structure of an NMOSFET, the method can be applied to the making of MOSFET of other structures to achieve the object of making MOSFET devices that are free from reverse short channel effect. It will be understood by those skill in the art that variations in the structure and/or process condition can be made without departing from the scope and the spirit of the invention.

What is claimed is:

1. A method of manufacturing MOSFET devices comprising source and drain regions doped with implanted impurity atoms in a semiconductor substrate, or in an epitaxial layer grown on the semiconductor substrate, and a subsurface channel doped with impurity atoms for the purpose of adjusting threshold voltage and prevention of punch-through, wherein the channel impurity implantation is made after the implantation and the subsequent thermal annealing of the sources and the drains of these devices.

2. The method of claim 1 wherein the active cell of said MOSFET device is defined by a pattern of field oxide.

3. The method of claim 1 wherein the MOSFET gate is polysilicon.

4. The method of claim 1 wherein said source and drain are formed by self-aligned arsenic implantation through the pattern window of said field oxide and said polysilicon gate.

5. The method of claim 1 wherein said channel impurity is boron.

6. The method of claim 1 wherein said channel impurity is implanted through the same pattern window as that for said source/drain implantation.

7. The method of claim 1 wherein said channel implant is made at a sufficient energy to form punch-through barriers below the source/drain junction.

8. A method of manufacturing MOSFET devices comprising the steps of:

providing field oxides on a silicon substrate by means of LOCOS process, followed by the removal of the LOCOS defining silicon nitride and silicon oxide films;

providing a gate oxide layer on said silicon substrate;

forming a polysilicon layer on said gate oxide layer;

coating said polysilicon layer with photoresist, exposing said photoresist through a mask for gate patterning, and developing said photoresist;

etching said polysilicon layer to form a pattern of polysilicon gates;

removing said photoresist;

doping the areas of said silicon substrate not covered by said field oxide and said polysilicon gates, using ion implantation to form sources and drains;

removing damage from said source/drain implantation using thermal annealing;

doping the areas of said silicon substrate not covered by said field oxide using ion implantation through gate oxides and through polysilicon gates to form channel stop layer and punch-through barrier.

9. The method of claim 8 wherein said field oxide has a thickness between 0.3 and 1.0 µm.

10. The method of claim 8 wherein said gate oxide is a thermal oxide grown at a temperature between about 750° and 900° C.

11. The method of claim 8 wherein said gate oxide has a thickness between about 50 and 200 Å.

12. The method of claim 8 wherein said polysilicon layer has a thickness between about 1500 and 3000 Å.

13. The method of claim 8 wherein said source and drain doping by the method of ion implantation is an arsenic implant using an ion beam of between about 10 to 80 keV, with an implant dose of between about $5 \times 10^{14}$ to $1 \times 10^{16}$ ions/cm$^2$.

14. The method of claim 8 wherein said annealing is a rapid thermal annealing, performed at a temperature of between about 900° to 1100° C., for a duration of between about 10 to 30 seconds.

15. The method of claim 8 wherein said implantation for channel doping is a boron implant, using an ion beam of between about 50 to 200 keV energy, and an implant dose of between about $1 \times 10^{12}$ to $1 \times 10^{14}$ ions/cm$^2$.

16. The method of claim 8 further comprising the steps of:

forming an insulating layer over the substrate, after forming said channel implant layer;

defining a pattern of source, drain, and gate contact holes using photolithography; and etching said contact holes through said insulating layer using anisotropic reactive ion etching.

* * * * *